(12) United States Patent
Klinedinst et al.

(10) Patent No.: US 6,602,547 B2
(45) Date of Patent: Aug. 5, 2003

(54) METHOD OF COATING PARTICLES BY VAPOR DEPOSITION

(75) Inventors: Keith A. Klinedinst, Hudson, MA (US); Christoforos Kazazis, Medford, MA (US); Daniel Carril, Nashua, NH (US)

(73) Assignee: Osram Sylvania Inc., Danvers, MA (US)

( * ) Notice: Subject to any disclaimer, the term of this patent is extended or adjusted under 35 U.S.C. 154(b) by 0 days.

(21) Appl. No.: 09/965,497

(22) Filed: Sep. 27, 2001

(65) Prior Publication Data

US 2003/0059530 A1 Mar. 27, 2003

(51) Int. Cl.$^7$ .................................................. B05D 7/00
(52) U.S. Cl. ...................... 427/212; 427/213; 427/220; 427/221; 427/248.1; 427/255.5; 427/255.6
(58) Field of Search ................................. 427/212, 213, 427/220, 221, 222, 248.1, 255.5, 255.6; 428/715, 716, 719, 724, DIG. 5

(56) References Cited

U.S. PATENT DOCUMENTS

| | | | | |
|---|---|---|---|---|
| 4,585,673 A | * | 4/1986 | Sigai | 252/301.4 P |
| 5,393,533 A | * | 2/1995 | Versic | 424/449 |
| 5,876,793 A | * | 3/1999 | Sherman et al. | 427/213 |

* cited by examiner

Primary Examiner—Michael Barr
Assistant Examiner—Elena Tsoy
(74) Attorney, Agent, or Firm—William E. Meyer; Robert F. Clark

(57) ABSTRACT

A new fluidized bed particle coating method is disclosed by the use of which coatings can be uniformly and conveniently deposited on the surfaces of fluidized particulate materials by vapor deposition processes at temperatures lower than those of the heated coating precursor transport lines. By this method, particle materials with relatively low surface temperatures may be brought into close proximity with a coating precursor containing gas stream characterized by a substantially higher gas volume temperature in such a way that the vaporized precursor molecules are caused to adsorb or condense on the relatively cold particle surfaces without also condensing on any other surface. Further, if the adsorbed precursor molecules are capable of reacting or polymerizing on the relatively cold particle surfaces, thus forming substantially continuous coatings on those surfaces, they may do so without also depositing such coatings on any other surfaces. Such coating deposition processes cannot be carried out using conventional fluidized bed deposition methods or equipment.

5 Claims, 14 Drawing Sheets

METHOD OF COATING PARTICLES BY VAPOR DEPOSITION

TECHNICAL FIELD

The invention relates to coated particles and particularly to coated phosphor particles. More particularly the invention is concerned with coated electroluminescent phosphor particles.

BACKGROUND ART

Finely divided materials are used in a great many products and applications. However, it is sometimes the case that the surface properties of the particle are not completely satisfactory for the intended application. In such cases, various surface modification techniques may be used to improve the performance of the particle. One way of changing the surface properties of a particle material is to coat each particle with a substance whose properties are both substantially different from those of the base material and more compatible with the environment of the intended application. For instance, phosphor particles may be protected from the harmful effects of the mercury plasma in an operating fluorescent lamp by the deposition of fully encapsulating coatings (U.S. Pat. No. 4,585,673; U.S. Pat. No. 5,051,277). In a similar way, electroluminescent phosphor may be protected from the effects of moisture in an operating electroluminescent lamp by the application of protective coatings (U.S. Pat. No. 5,080,928; U.S. Pat. No. 6,064,150).

In the cited references, as well as in other similar references, the coatings are deposited via chemical vapor deposition reactions carried out in fluidized particle beds at elevated temperatures. The vaporized coating precursors are brought into the heated fluidized bed via tubing heated so that the vaporized precursors do not condense or react prior to entering the bed and adsorbing on the fluidized particle surfaces. To accomplish this, the reaction temperature, that is, the fluidized bed temperature, generally must be no lower than the lowest heated precursor transport line temperature. This is because a fluidized bed is an excellent heat exchange medium. It is practically impossible to maintain the temperature of a gas delivery line entering a fluidized bed at a temperature substantially higher or, lower than the temperature of the fluidized bed itself. The gas delivery line then cannot have a temperature substantially different from the temperature of the fluidized particles. Therefore, such equipment cannot be used with a coating deposition processes when the maximum deposition temperature is less than the minimum heated delivery line temperature. The coating material would otherwise react in, coat and eventually clog the delivery line.

One class of coating deposition processes which cannot be carried out using a traditional fluidized bed deposition system are the so called vapor deposition processes (A. Kubono, et al, Prog. Polym. Sci., 19, 389–438, 1994). Applying such a process to a typical fluidized bed reactor, the coating material to be deposited would be transported into the fluidized bed reactor as a vapor via an inert carrier gas, at which point the vaporized coating material would mix with the finely divided coating substrate. However, to adsorb (deposit) the vaporized coating material on the surfaces of the fluidizing particles, the fluidized bed temperature must be substantially lower than that of the incoming gas stream. This, however, is physically impossible since the excellent heat exchange properties of the fluidized bed causes the temperature of the incoming gas line near to the fluidized bed to be substantially the same as that of the fluidized bed itself. Thus, the coating material either deposits in the end of the gas delivery tube (before coming into contact with the fluidized particles) or it is not deposited at all, depending on the temperature of the fluidized bed and the partial pressure of the vaporized coating material in the incoming gas stream.

A second class of coating deposition processes which cannot be carried out using a traditional fluidized bed deposition systems are the so called vapor deposition polymerization processes (A. Kubono, et al, Prog. Polym. Sci., 19, 389–438, 1994). Processes of this type are similar to the simpler vapor deposition processes described above, except that the coatings are built up by the repeated reaction (polymerization) of the vaporized precursor molecules on the surfaces of the fluidized particles, rather than by simple adsorption. Such coatings may be formed by the reaction of a single precursor molecule, for example, by the polymerization of p-xylylene (P. Kramer, et al, J. of Polymer Science: Polymer Chemistry Edition, 22, 475–491, 1984.), or by the reaction of two different monomeric precursor molecules, for example by, the reaction of a diamine with a dianhydride to form a polyimide (K. Iida, et al, Japanese Journal of Applied Physics, 28, 2552–2555, 1989). Otherwise, the considerations are identical to those outlined above for the simpler situation involving vapor deposition only.

Accordingly, there is a need for a method and equipment the use of which useful coatings can be uniformly deposited on the surfaces of fluidized particulate materials by vapor deposition processes at temperatures lower than those of the heated coating precursor transport lines.

DISCLOSURE OF THE INVENTION

A new fluidized bed particle coating method by the use of which coatings can be uniformly and conveniently deposited on the surfaces of fluidized particulate materials by vapor deposition processes at temperatures lower than those of the heated coating precursor transport lines. Particle materials with relatively low surface temperatures may be brought into close proximity with a coating precursor containing gas stream characterized by a substantially higher gas volume temperature in such a way that the precursor molecules adsorb or condense on the relatively cold particle surfaces without also condensing on the equipment surfaces. Further, if the adsorbed precursor molecules are capable of reacting or polymerizing on the relatively cold particle surfaces, thus forming substantially continuous coatings on those surfaces, then they may do so without significant deposition of the coating material on the equipment surfaces.

BEST MODE FOR CARRYING OUT THE INVENTION

Figure 1:
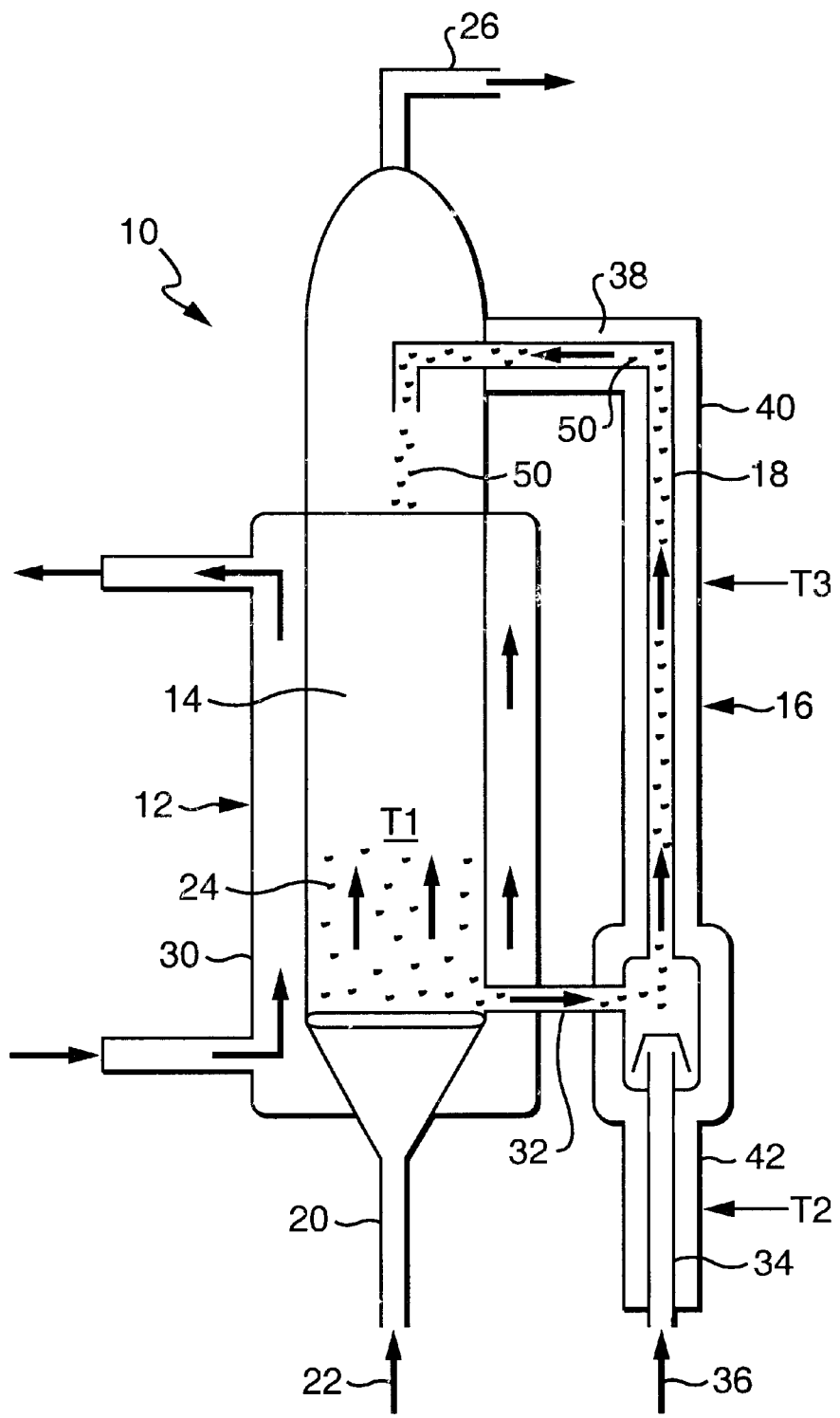
FIG. 1 shows a schematic drawing of the coating equipment.

The preferred embodiment of the equipment 10 used to practice the method is shown schematically in FIG. 1. Equipment to implement the method can be generalized as two fluidized bed reactors connected in parallel. The main reactor 12 has a relatively large diameter reactor chamber 14. The second reactor, the fast reactor 16, has a relatively smaller diameter reaction chamber, or riser 18. The main reactor 12 has a typical fluidized bed reactor construction, with a bottom inlet 20 for an inert fluidizing gas 22. The inflow of the fluidizing gas 22 supports particles 24 in the large diameter chamber 14 in the main reactor 12. The fluidizing gas 22 flows up through the particles 24, exits through a top outlet 26, and may be recirculated back through the inlet 20. In operation the fluidizing gas 22 then churns and suspends the particles 24 in the main reactor 12 large chamber 14. The main reactor 12 typically includes a heat exchanger jacket 30 extending over at least the region adjacent where the particles 24 are suspended so as to maintain the suspended particles 24 at or below a reaction temperature T1.

Coupled to the main reactor 12 adjacent where the particles 24 would typically be suspended is a feed pipe 32 leading to the fast reactor 16 and riser 18. A portion of the particles 24 in suspension may then be continuously fed from the main reactor 12 to the riser 18. The fast reactor 16 also includes a bottom inlet 34 for a gas stream 36 containing a coating precursor material, which may be a mixture of several deposition components and an inert carrier gas. The preferred precursor coating material has a vapor deposition or vapor deposition polymerization (cooling) reaction point at or above T1. The precursor material forms the final coating material during cooling. This is referred to herein as a cooling reaction that occurs at or below a cooling reaction point (temperature). The precursor material is supplied from the inlet 34 into the small diameter riser 18 at a temperature T2 higher than its cooling reaction point. The fast reactor 16 includes a top outlet, preferably formed as a return pipe 38 leading back to the main reactor 12. The fast reactor 16 has a relatively small diameter with respect to the particle size and the flow rates of the inlet streams from feed pipe 32 and bottom inlet 34. The particles 24 fed into the fast reactor 16 are then mixed with the inlet gas stream 36 and the precursor material and lifted through the riser 18 and returned to the main reactor 14. Preferably, the fast reactor 16 also includes a heat exchange jacket 40 located along a portion of the riser 18 to maintain the riser 18 at a temperature T3 greater than T1 and greater than the cooling reaction point. This is to deter the deposition of the precursor material on the riser 18. The bottom inlet 34 may also include a heater 42 to maintain a temperature of T2 in the inlet gas stream 36.

The length of the riser 18, the temperature difference between the T1 and T3, the initial mass of the particles 24 and the speed of the particle flow through the riser 18 are adjusted so that the surface temperature of the particles 24 is maintained below the cooling reaction temperature in riser 18, thereby causing the precursor material to condense and if possible react on the relatively cooler particles 24 as they pass through the length of the riser 18. Preferably the cooling reaction is completed in the riser 18, but it may be completed it the main reactor. Similarly, it is preferable that substantially all of the precursor material be attached to the particles, so that little or none of the raw precursor material enters the main reactor. It is understood that some small quantity of the precursor may be exhausted into the main reactor to be removed with the exiting fluidizing gas, or possibly combined in the main reactor. The tolerable amount of such overflowing precursor will depend on the details of the material and the reactor operation. A rough goal would be less then 1 percent of the precursor material exits other than a particle coating.

The coated particles 50, bearing the coating of condensed precursor material are then passed through return pipe 38 into the upper regions of the main reactor 12. The upper end of the riser 18 is positioned so that a particle 50 exiting the riser 18 reenters the main reactor 12 preferably at or near to the top of the main reactor 12, but may be at any convenient position in the main reactor 12. Ideally at this point all of the precursor coating material in the exiting gas stream has been deposited on the particles and little or none exits to the main reactor 12. Due to the expanded diameter, the coated particles 50 are no longer supported against gravity by the gas 22 flow. The coated particles 50 then drop by the force of gravity through the relatively cooler T1 temperature zone, and are cooled in the process. The coating material on the descending coated particles 50 may then continue through its cooling reaction. The reacted coated particles 50 merge with the other particles 24, and may be statistically recycled through the fast reactor 16 for additional coatings. If there is any of the precursor coating material entering through the return pipe in the gas stream, it is drawn out of the main reactor 12, by the exiting fluidizing gas 22 through the top outlet 26. The initial particles 24 and the coated particles 50 may have differing densities and thereby be segregated statistically, elevationally in the main reactor 12. The height location of the feed pipe 32 may then be adjusted to favor reception of uncoated or lesser coated particles 24. With sufficient time, all of the uncoated particles 24 may then be cycled through the relatively hotter fast reactor 16 for a surface coating that is then reacted on return to the relatively cooler main reactor 12. In this fashion, substantially evenly coated particles may be made, and similarly particles of similar size may be made.

As shown in the FIG. 1, there are three key temperatures: T1, the material temperature of the particles in the main reactor 12; T2, the gas temperature of the inlet 34 and therefore the temperature of the precursor containing gas stream 36; and, T3, the wall temperature of the riser 18. Also indicated in the FIG. 1 are the separate heaters or heat exchangers (30, 40, 42) to maintain the three zones at these different temperatures throughout the duration of the coating process. The relationship between these three temperatures is essential to the operation of the coating method. For the successful operation of the method material temperature T1 must be less than gas stream temperature T2 and wall riser temperature T3. More particularly, temperatures T2 and T3 must be high enough to prevent condensation or reaction of the coating precursors on the inside surfaces of the incoming bottom inlet 34 or riser 18, respectively. On the other hand, material temperature T1 must be no greater than the condensation temperature of the coating precursor. When the coating reaction is viewed as a condensation process, the equilibrium vapor pressure of the condensed coating precursor material at temperature T1 must be below the partial pressure of the precursor in the incoming precursor containing gas stream 36. Conversely, the equilibrium vapor pressure of the condensed coating precursor material at gas temperature T2 and at wall temperature T3 must be above the partial pressure of the precursor material in the incoming gas stream 36.

As the particles 24 with a surface temperature T1 enter the bottom of the riser 18, they become entrained in the precursor containing gas stream 36 entering the bottom of the riser 18 at temperature T2. As the vaporized coating precursor molecules come into contact with relatively cold particle 24 surfaces, they adsorb on the surfaces of the particles 24. The adsorbed precursor molecules may react (polymerize) on the surfaces of the particles 24 to form a coating via vapor deposition polymerization. The precursor coated particles 24 then travel rapidly up the riser 18 and reenter the main reactor 12. Because the incoming precursor containing gas 36 and riser 18 are maintained at temperatures higher than that of the particles 24 in the main reactor 12, the precursor coated particles 24 are heated somewhat as they travel up and out of the riser 18. However, the extent of this heating is limited by the relatively short residence time of the particles 24 (initial) or 50 (coated) in the riser 18, and it is important that the temperature of the main reactor 12, T1, be low enough and the residence time of the particles 24 in the riser be short enough to prevent the desorption of adsorbed precursor molecules prior to the point at which the pneumatically transported particles 24 exit the riser and reenter the main reactor 12.

The incoming particles 24 have a sufficient thermal mass, and a low enough temperature and they pass through the riser 18 sufficiently quickly, that they emerge from the riser 18 with a condensation coating of the precursor material. Given the number of particles 24 and the relatively small size (narrowness) of the riser 18, the incoming particles 24 thermally overpower available precursor material and condense most if not all of it on the surfaces of the particles 24. Alternatively, the precursor vapor is just above its reaction temperature, and sufficiently dilute, so that substantially all of it is condensed and remains condensed on the particles 24 as they pass through the riser 18. If the particles 24 are too small, or the precursor material is too hot, the particles cannot induce the condensation reaction, or as the case may be, they cannot retain the material resulting from the condensation reaction. If the thermal density of the precursor material is too great, the incoming particles are overheated and uncondensed precursor material overflows into the main reactor.

Figure 2:
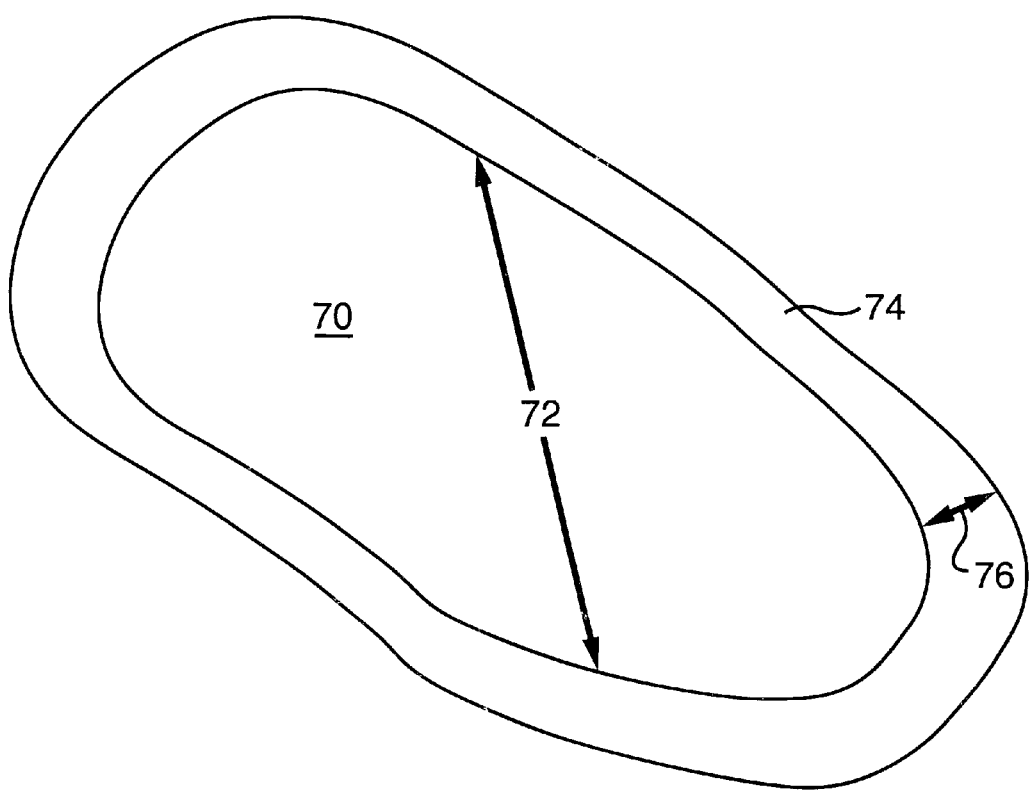
FIG. 2 shows a schematic view of a coated particle.

The preferred core particle may be any of the numerous phosphor formulations known in the arts of lamp and electroluminecscent lamp making, or combinations thereof. Phosphors can have relatively high deterioration temperatures, thereby tolerating coating by any of numerous vapor deposition materials reactively occurring at lower temperatures. FIG. 2 shows a schematic view of a coated particle. The core particle 70 as a phosphor can have an average diameter 72 ranging from 0.5 microns to 200 microns. The coating 74 can have an average thickness 76 ranging from 100 angstroms to 2 microns. It is understood that variations in the individual coatings will occur, some may be uneven, too thin, too thick or incomplete. Examples of such phosphors cores would include at least the zinc based phosphors, including the zinc based electroluminescent phosphors. These phosphors generally emit light on electromagnetic, ultraviolet light or electric field stimulation. More broadly, it is believe that the method described herein is useful for any number of core particles to be coated with any number of vapor deposition or vapor deposition polymerization coating materials.

The coating may be deposited by vapor deposition. It is particularly useful to coat a phosphor particle with a material that resists penetration by water or similar materials that may degrade the function of the phosphor. Numerous combinations of coating materials may be used in a vapor deposition process described. Some of the preferred alternatives include paraffins, poly(vinylidene fluoride), polyethylene, and Π-conjugated electrically conductive polymers such as poly(p-phenylene), poly(2,5-thienylene), poly(2,2'-bipyridine-5,5'-diyl), and poly(pyridine-2-5-diyl).

The coating may also be deposited by vapor deposition polymerization. Again, numerous combinations of coating materials may be used in the vapor deposition polymerization process described. Some of the preferred alternatives include vapor polymeric aminoborane, poly(p-xylylene) and its derivatives such as (2,2)paracyclophane and 1,4-dichloro-(2,2)paracyclophane, p-phenylene-terephthalamide, 4,4'-diaminodiphenylether, alkylpolyamide, poly(decamethylene-terephthalamide, and poly(decamethyl-enepyromellitamic acid.

The following examples are presented to illustrate the particle coating method. The first example demonstrates the circulation of the particle material from the main reactor 12 into the bottom of the riser 18, then up the riser 18 and back into the main reactor 12. The subsequent examples demonstrate the use of the method to deposit essentially continuous protective coatings on the surfaces of electroluminescent phosphor particles via vapor deposition polymerization.

EXAMPLE 1

In this example, the production equipment was layed out as in FIG. 1. A 2 inch diameter main reactor was used along with a 0.25 inch diameter riser. 800 grams of Sylvania type 723 electroluminescent phosphor were poured into the reactor, and purified nitrogen was used as both the fluidizing gas and the pneumatic transport gas. The fluidizing gas flow rate ranged between 1.0 and 5.0 liters per minute, while the riser gas flow ranged between 200 and 700 standard cubic centimeters per minute (sccm). The same series of experiments were carried out with the main reactor at room temperature with unhumidified nitrogen and with the main reactor maintained at 200° C. with the nitrogen passing through a room temperature water bubbler prior to entering the bed.

Two basic tests were carried out. In the first case, the riser gas flow was set to only 200 sccm and the main reactor fluidizing gas flow was increased from 1.0 to 5.0 liters per minute in 1.0 liter per minute increments. At each fluidizing gas flow rate, the rate of phosphor particle transport (up and out of the riser) was determined using a stopwatch and an initially empty collection bucket of known volume. In the second case, the fluidizing gas flow was set to 1.0 liter per minute and the riser gas flow was increased from 200 to 700 sccm in 100 sccm increments. At each riser gas flow, the rate of phosphor transport up and out of the riser was determined as before. The phosphor particle recirculation rate (grams per minute) and the time for an amount of phosphor equivalent to the entire main reactor bed volume (800 grams) to be recirculated via the riser (in minutes) were calculated after each measurement.

Figure 3:
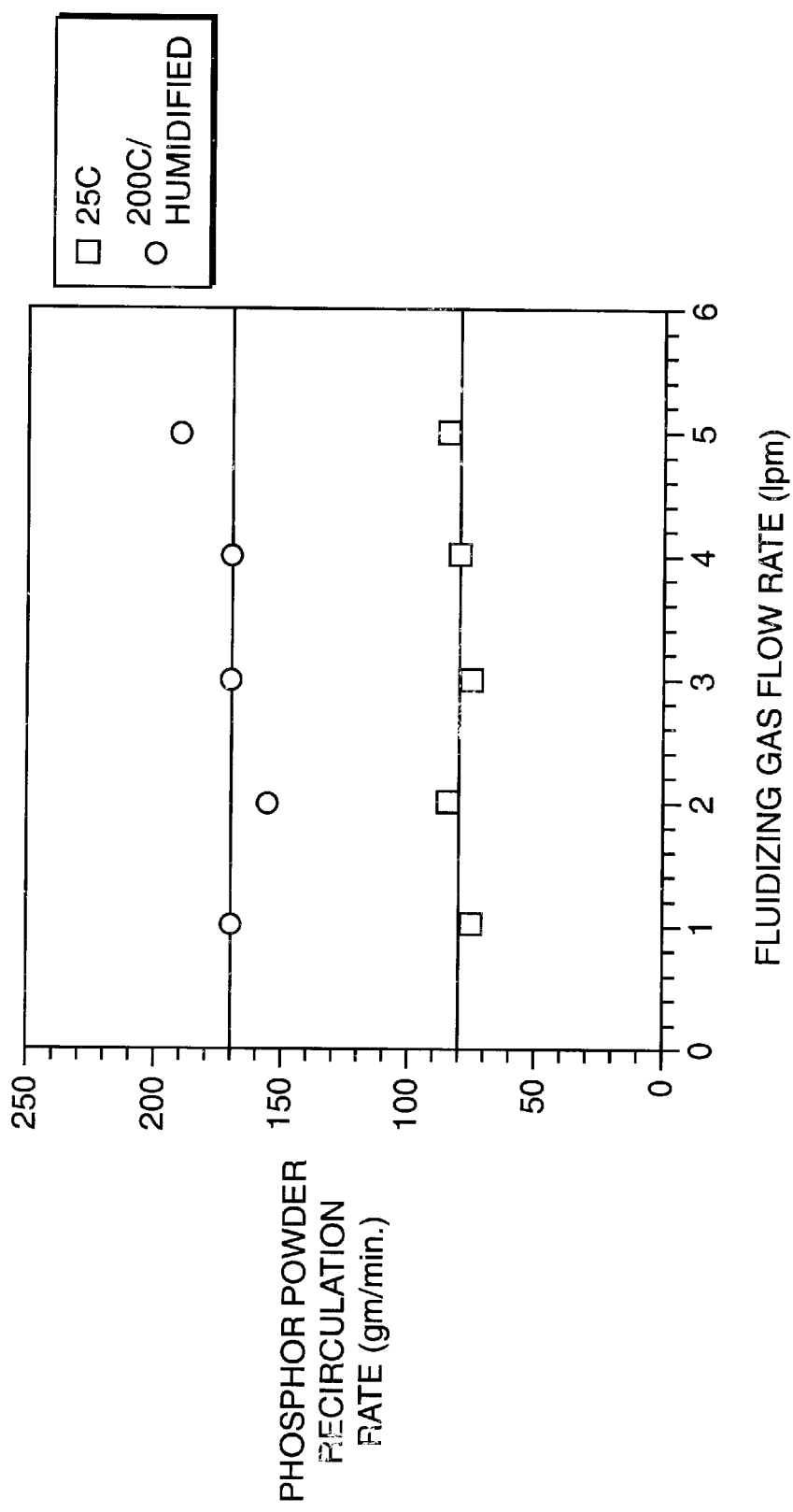
FIG. 3 shows a chart of the phosphor particle recirculation rate vs. the fluidizing gas flow rate.
Figure 4:
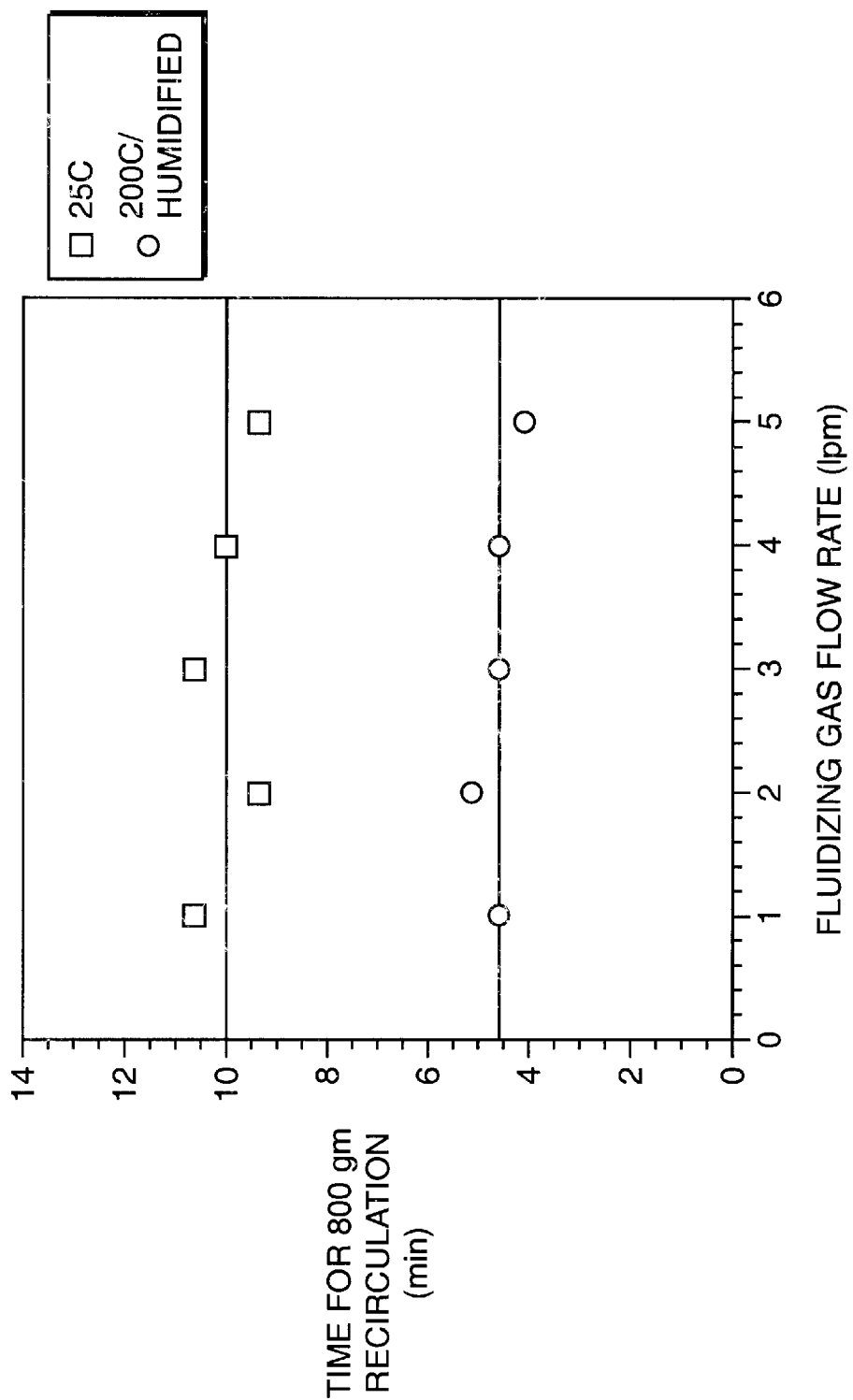
FIG. 4 shows a chart of the recirculation time for 800 grams of phosphor vs. various gas fluidizing flow rates.

FIG. 3 shows a chart of the phosphor particle recirculation rate vs. the fluidizing gas flow rate with 200 sccm riser. As shown in FIG. 3, with a riser gas flow rate of only 200 sccm, the particle recirculation rate was found to be essentially independent of the fluidizing gas flow both at room temperature with unhumidified gas and at 200° C. with humidified fluidizing gas. However, the pneumatic transport rate with humidified gas at 200° C. was about twice that measured at room temperature with unhumidified gas. FIG. 4 shows a chart of the recirculation time for 800 grams of phosphor vs. various gas fluidizing flow rates at room temperature without humidification and at 200° C. with humidification. As indicated in FIG. 4, the corresponding total external recirculation times were about 10 minutes at room temperature with unhumidified gas, but only about 5.0 minutes at 200° C. with humidified gas.

Figure 5:
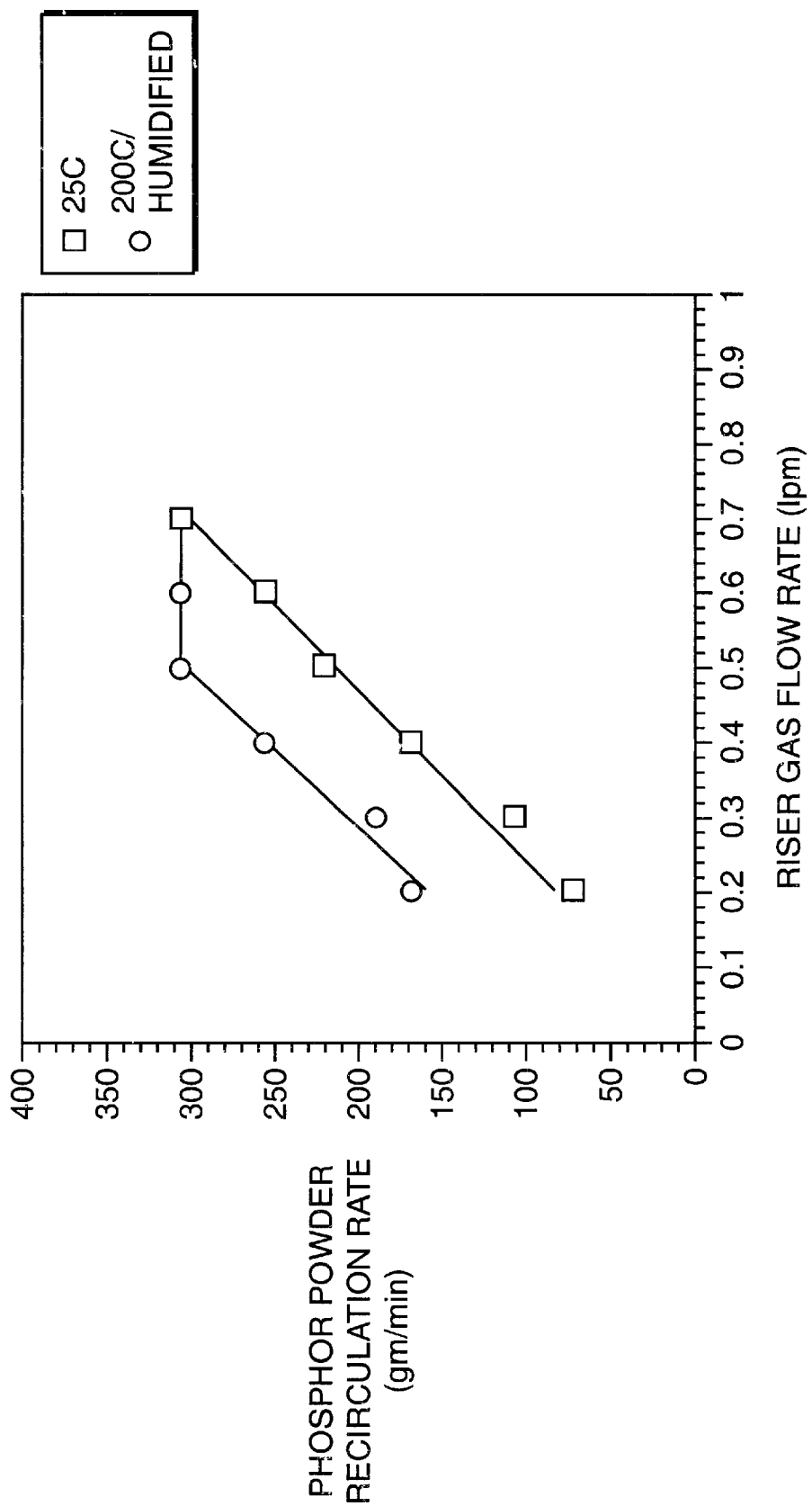
FIG. 5 shows a chart of phosphor particle recirculation rate vs. the riser gas flow rate.

FIG. 5 shows a chart of the phosphor particle recirculation rate vs. the riser gas flow rate in 1.0 liter per minute increases in the riser gas flow rate. Again mearsurements were made for fluidizing gases at room temperature without humidification, and at 200° C. with humidification. The results are slightly more complicated here. At both main reactor bed temperatures, the recirculation (pneumatic transport) rate was found to increase approximately linearly with the riser gas flow rate, with the transport rate at a particular riser gas flow increasing further with increasing main reactor bed temperature and gas humidification. However, the maximum transport rate attainable was about 300 grams per minute. This apparent maximum for the recirculation rate is believed to be the result of the relatively narrow (¼ inch OD) tubing through which the phosphor particles must pass to enter the bottom of the riser. The larger the diameter of the feed pipe and, indeed, the larger the diameter of the entire riser assembly, the larger the apparent maximum transport rate should become.

Figure 6:
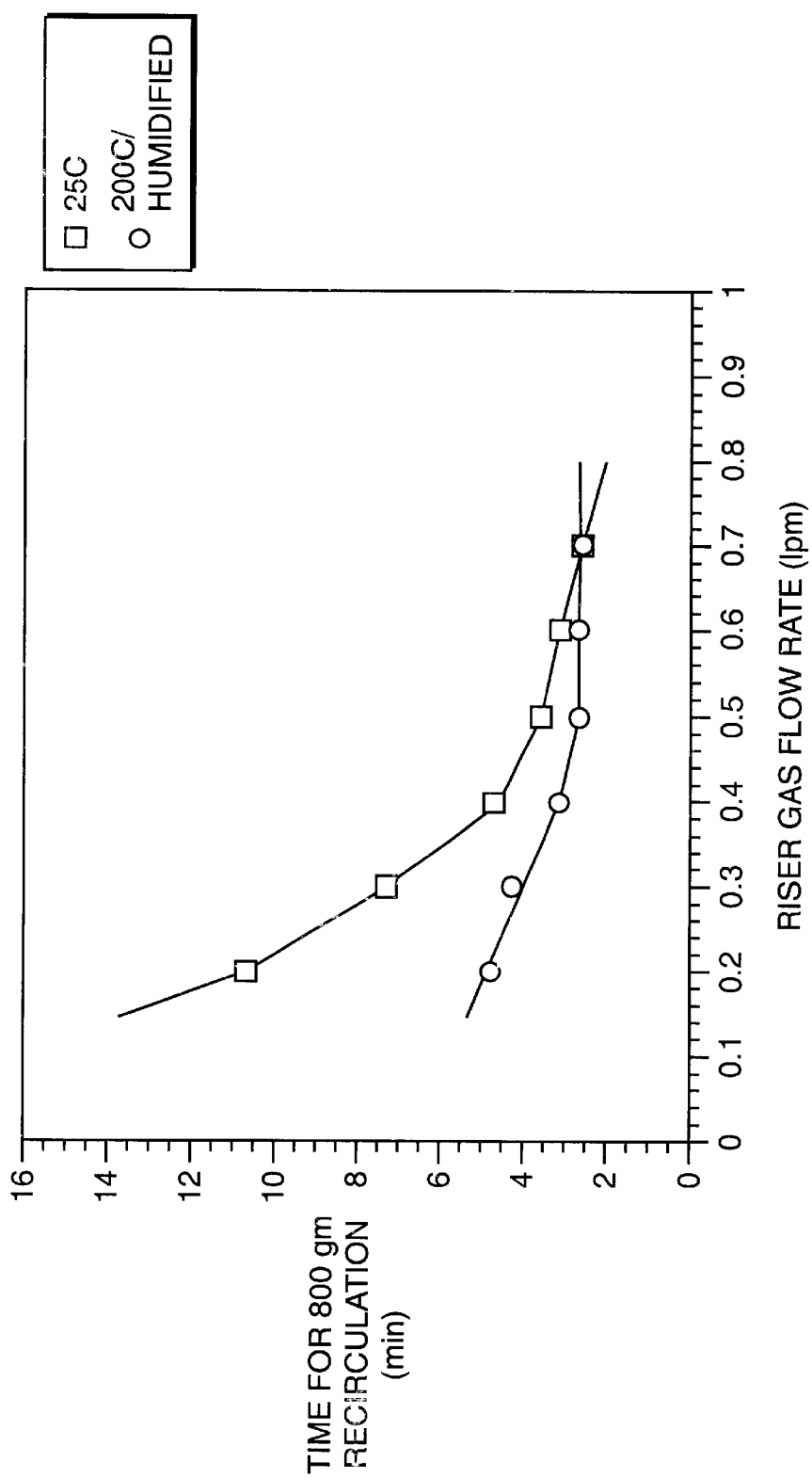
FIG. 6 shows a chart of recirculation times for 800 grams phosphor vs. the riser gas flow rate.

FIG. 6 shows a chart of recirculation times for 800 grams phosphor vs. the riser gas flow rate in 0.1 liter per minute increases in the riser gas flow rate. Again, measurements were made for the two fluidizing gas types studied, gas at room temperature without humidification, and gas at 200° C. with humidification. Increasing the riser flow rate increases the recirculation time for the volume of material held in the main reactor, up to a limit likely determined by choke effects of the inlet and outlet pipes. From data like that in FIGS. 3 to 6, along with the measurements of the riser a residence time of a particle in the riser can be determined, which is useful in tuning the system operation.

EXAMPLE 2

Figure 7:
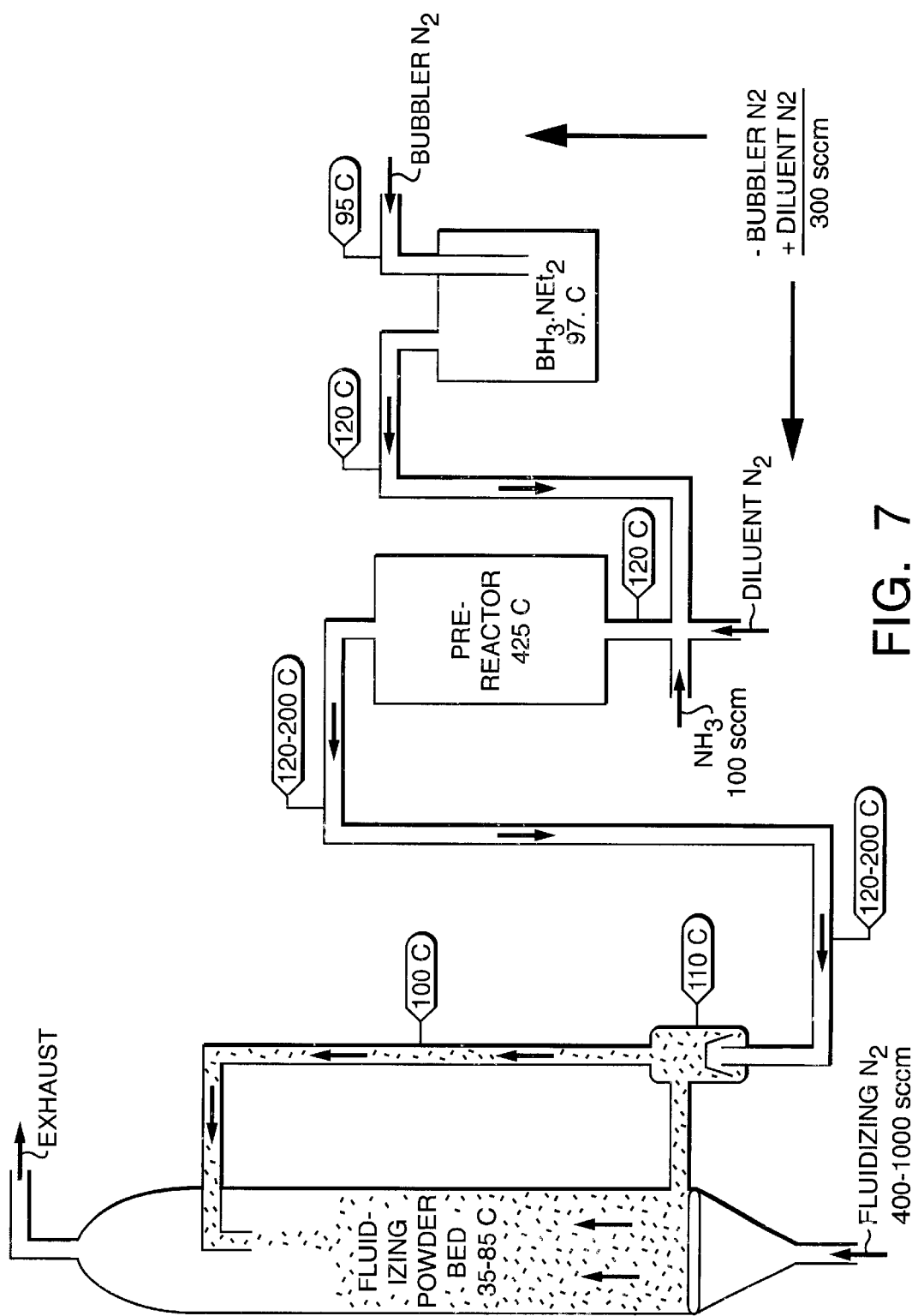
FIG. 7 shows a schematic diagram of the preferred equipment for coating particles with polymeric aminoborane.

FIG. 7 shows a schematic diagram of the preferred equipment for coating particles with polymeric aminoborane. Since the precursor materials are reactive on cooling, they must be adequately combined in the precursor gas stream prior to deposition on the particles in the riser. In this example the fluidized particles are coated with polymneraminoborane via vapor deposition polymerization. The process is for the vapor deposition of polymeric aminoborane. As indicated, the recirculating fluidized bed is the same as that shown in FIG. 1, with the temperature of the particle material in the main reactor T1, fixed at a value between 35° C. and 65° C., and the temperature of the incoming precursor containing gas line, T2, set between 120° C. and 200° C. The temperature of the riser wall T3, was set to 100° C., with the bottom inlet of the riser set at a slightly higher temperature, 110° C. The main reactor had a 1.0 inch diameter, while the diameter of the riser was 0.25 inch. Purified nitrogen was used as the fluidizing gas, flowing at a rate between 400 and 1000 sccm. The particle material was Sylvania type 723 ZnS:Cu electroluminescent phosphor, and the weight of phosphor used in the various runs ranged between 40 and 100 grams.

The gaseous precursor for the deposition of polymeric aminoborane on the surface of the fluidized particles was generated by heating a mixture of gaseous ammonia and triethylamineborane at a temperature of 425° C. Vaporized triethylamineborane was produced by bubbling purified nitrogen gas through liquid triethylamineborane which was maintained at a temperature of 97° C. The triethylamineborane containing gas stream was combined with gaseous ammonia, flowing at 100 sccm, just upstream of the 425° C. tubular prereactor. Also, an additional amount of purified nitrogen gas was added as a diluent. So that the gas velocity in the 425° C. prereactor would always remain the same, the diluent nitrogen flow was adjusted so that the sum of the diluent and carrier nitrogen flows always equaled 300 sccm.

A series of nine particle coating runs were made with the following quantities fixed at particular values during each run: weight of ZnS:Cu phosphor particle, main reactor temperature, fluidization gas flow rate, bubbler gas flow rate, and run time. The values of these parameters for each of the nine runs are listed in Table I.

TABLE I

Particle Coating Run Parameters

| Run No. | Particle Weight (gm) | Bed Temp. (° C.) | Fluid. Gas Flow (sccm) | Bubbler Gas Flow (sccm) | Run Time (hr) |
|---|---|---|---|---|---|
| 1 | 100 | 50 | 400 | 200 | 8.5 |
| 2 | 40 | 55 | 400 | 200 | 11 |
| 3 | 80 | 65 | 400 | 200 | 15 |
| 4 | 80 | 35 | 1000 | 200 | 10 |
| 5 | 80 | 35 | 1000 | 100 | 20 |
| 6 | 80 | 35 | 1000 | 150 | 15 |
| 7 | 80 | 50 | 1000 | 200 | 10 |
| 8 | 80 | 65 | 1000 | 200 | 26 |
| 9 | 80 | 65 | 1000 | 200 | 16 |

After each run, samples of the homogenized phosphor particles were analyzed by SNMS and ESCA spectroscopy to determine the approximate thicknesses of the coatings and the chemical compositions of the surfaces, respectively. The approximate coating thicknesses and surface compositions (expressed as atomic percent composition) are listed in Table II for each of the nine runs. Also shown are the results obtained for a sample of the uncoated phosphor.

TABLE II

Coating Thicknesses and Surface Compositions

| Run No. | Coating Thickness (A) | Surface Composition (atomic percent) | | | | |
|---|---|---|---|---|---|---|
| | | Zn | S | B | N | O |
| 1 | 800 | 0.7 | 0.4 | 46 | 50 | 3.6 |
| 2 | 400 | 1.1 | 0.9 | 45 | 48 | 5.4 |
| 3 | 300 | 3.2 | 3.0 | 41 | 47 | 5.8 |
| 4 | 700 | 1.6 | 1.4 | 45 | 47 | 5.4 |
| 5 | 600 | 1.0 | 0.7 | 45 | 48 | 5.8 |
| 6 | 600 | 1.0 | 1.0 | 45 | 47 | 5.8 |
| 7 | 700 | 1.5 | 1.3 | 44 | 47 | 5.9 |
| 8 | 1200 | 0.3 | 0.2 | 44 | 47 | 8.2 |

TABLE II-continued

Coating Thicknesses and Surface Compositions

| Run No. | Coating Thickness (Å) | Surface Composition (atomic percent) | | | | |
|---|---|---|---|---|---|---|
| | | Zn | S | B | N | O |
| 9 | 100 | 33 | 27 | 10 | 8.6 | 22 |
| Uncoated Phosphor | 0 | 41 | 42 | | | 14 |

Figure 8:
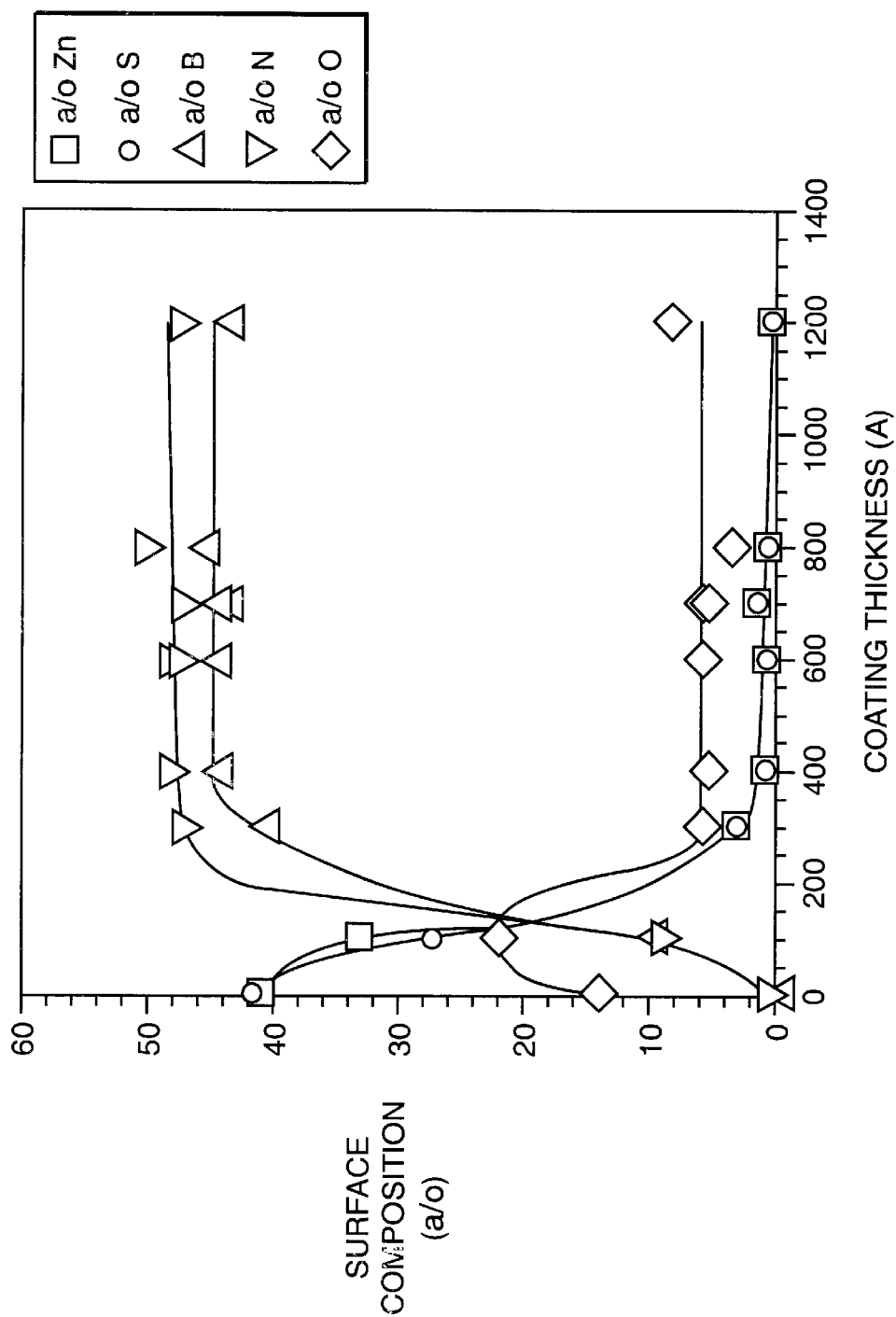
FIG. 8 shows a chart of surface composition (ESCA) vs. coating thickness of coated particles.

FIG. 8 shows a chart of the surface composition (ESCA) vs. the coating thickness of coated particles for the runs quantified in Table II. The atomic percentages of the various components on the surface are shown. As expected, the greater the coating thickness, the smaller the signals from the core particle material, here the zinc and sulfur, and the greater the signal from the coating material, here the boron and nitrogen. The particle surfaces appear to be essentially completely coated with polymeric aminoborane for coating thicknesses greater than about 400 Angstroms.

EXAMPLE 3

Another coating run was carried out in the same way as were the nine runs described in Example 2, except that the riser was eliminated so that the end of the precursor containing gas line was located in the fluidized particle bed itself. 100 grams of ZnS:Cu phosphor were used in this run with a 45° C. bed temperature. The fluidization gas flow rate was 1000 sccm, and the bubbler gas flow rate was 200 sccm. All of these run parameters were in the parameter ranges used in the nine runs described in Example 2.

The run was continued for 2.5 hours, after which the gas flows were stopped and the bed was cooled. The phosphor particle bed and the end of the precursor delivery line were examined. During the run, the temperature of the precursor delivery line had been the same as that of the fluidized particle bed with which it was in contact. It was found that polymeric aminoborane had deposited on the inside of the precursor delivery line so that there was only a small opening remaining. Additionally, it was observed that the portion of the coating precursor which did not adsorb and react on the inside of the delivery tube had, instead, rapidly adsorbed and reacted on the surfaces of the phosphor particles located near to the end of the gas delivery tube in the particle bed. The very rapid deposition of polymeric aminoborane in the particle bed caused the phosphor particles to agglomerate and stick together. In fact, the particles were virtually glued together by the polymeric aminoborane.

This example demonstrates the fact that vapor deposition processes such as the deposition of polymeric aminoborane cannot be carried out successfully using a traditional fluidized bed deposition method in which the precursor containing delivery line terminates in the fluidized particle bed. On the other hand, as shown in Example 2, such deposition processes can be carried out very successfully using the new fluidized bed particle coating method that is described.

EXAMPLE 4

Figure 9:
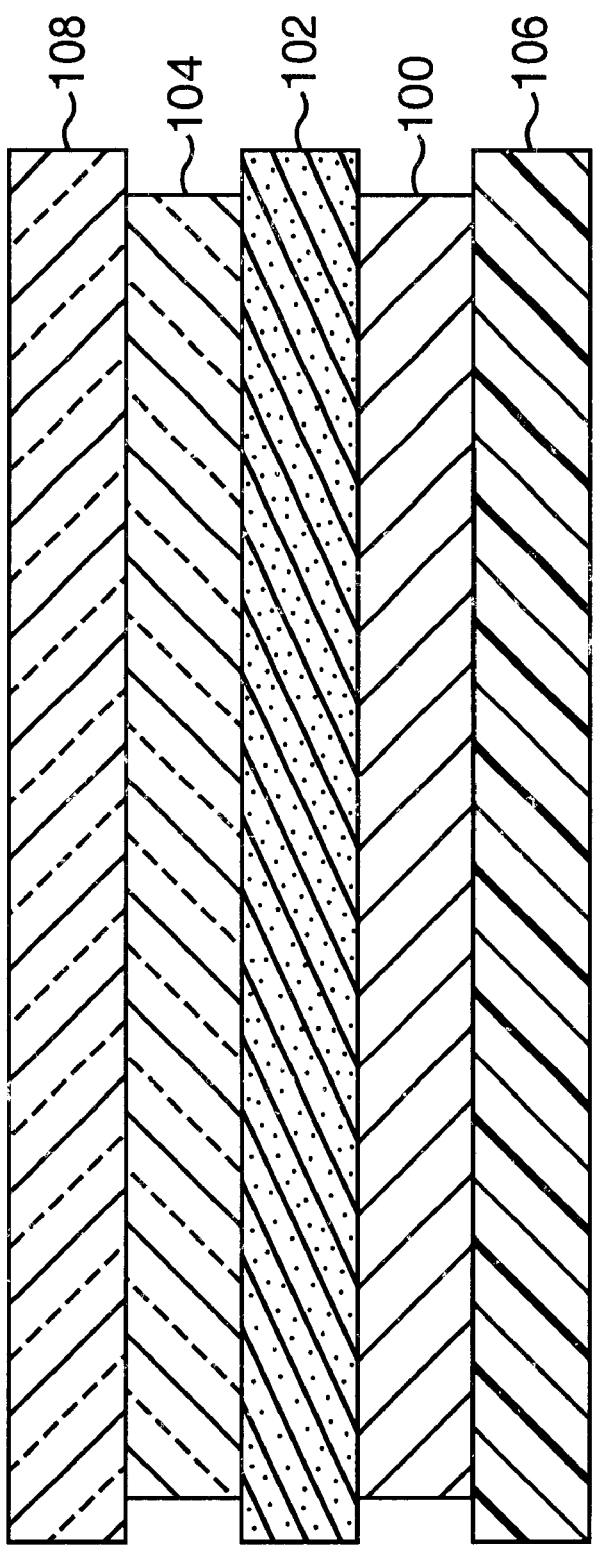
FIG. 9 shows schematic a construction for an electroluminescent lamp.

FIG. 9 shows a construction for an electroluminescent lamp. A first conductive layer 100, and a second conductive layer 104 sandwich an intermediate capacitive layer including a phosphor material. The lamp may be further protected with protective layers 106, 108 to prevent moisture from degrading the lamp. Electroluminescent lamps of such a standard construction were fabricated using the coated phosphors produced in the first three runs described in Example 2 above. An additional lamp was fabricated using the uncoated phosphor. The lamps were packaged between two sheets of moisture permeable plastic film so that the effectiveness of the particle coating as a moisture barrier could be gauged from a measurement of lamp brightness as a function of time. The lamps were all operated using a 100 volt, 400 Hz power supply in a 50 percent relative humidity atmosphere at 21° C. The approximate coating thicknesses are listed in Table III along with the electroluminescent lamp brightnesses measured after burning for 2 hours and for 24 hours. Also listed are the differences between the 2 hour and the 24 hour brightnesses along with the percent decrease in brightness between 2 and 24 hours of burning. B(fL) in Table III is brightness in foot Lamberts.

TABLE III

Coating Thickness and EL Lamp Brightness Data

| Run No. | Coating Thickness (Å) | B(fL) (2 hr) | B(fL) (24 hr) | B(fL) | % B |
|---|---|---|---|---|---|
| 1 | 800 | 29.5 | 24.6 | 4.7 | 15.6 |
| 2 | 400 | 31.2 | 22.4 | 8.8 | 28.2 |
| 3 | 300 | 31.1 | 21.7 | 9.4 | 30.2 |
| Uncoated Phosphor | 0 | 31.5 | 11.3 | 20.2 | 64.1 |

Figure 10:
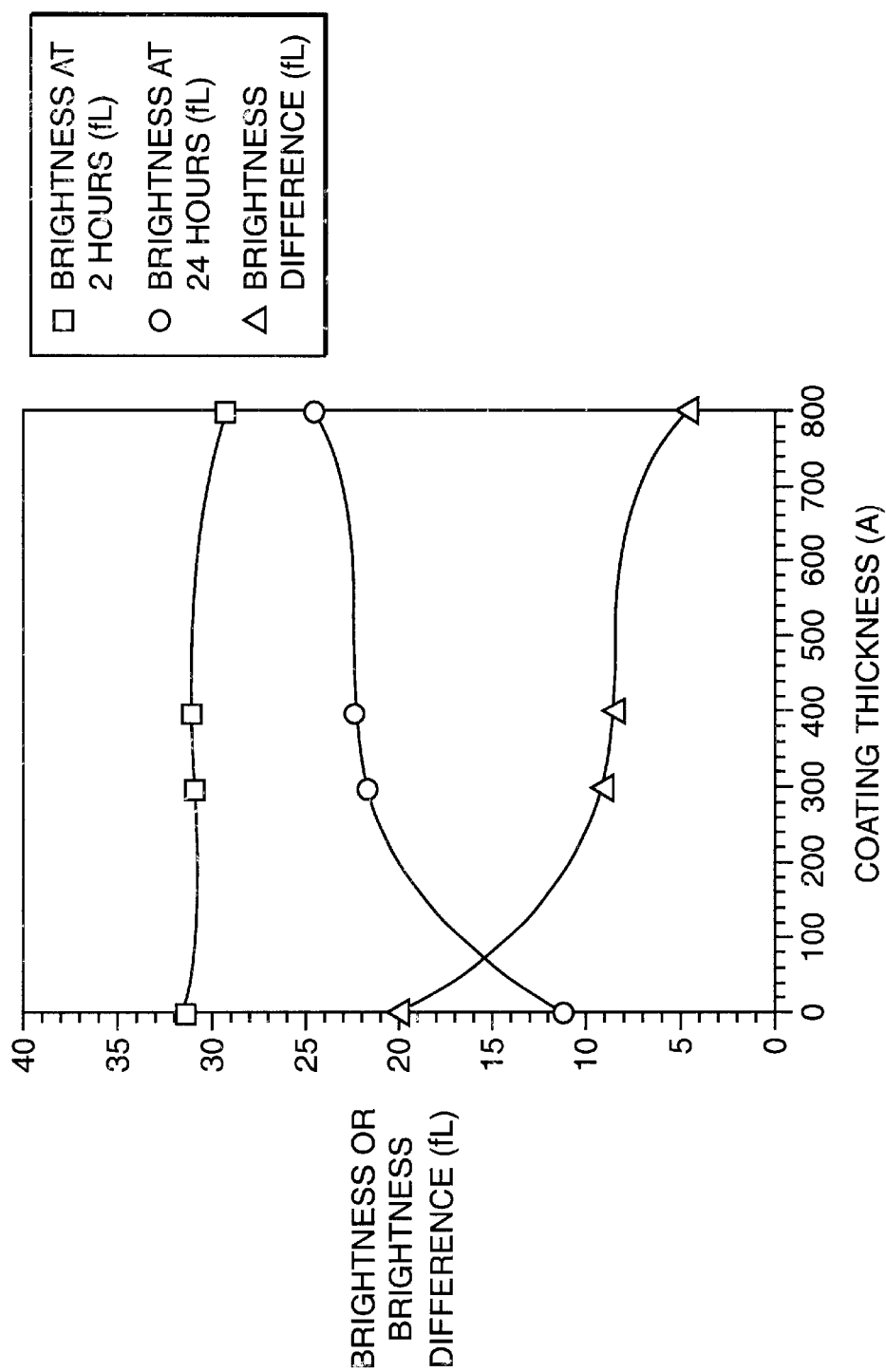
FIG. 10 shows a chart of electroluminescent lamp brightnesses vs. coating thickness in angstroms.
Figure 11:
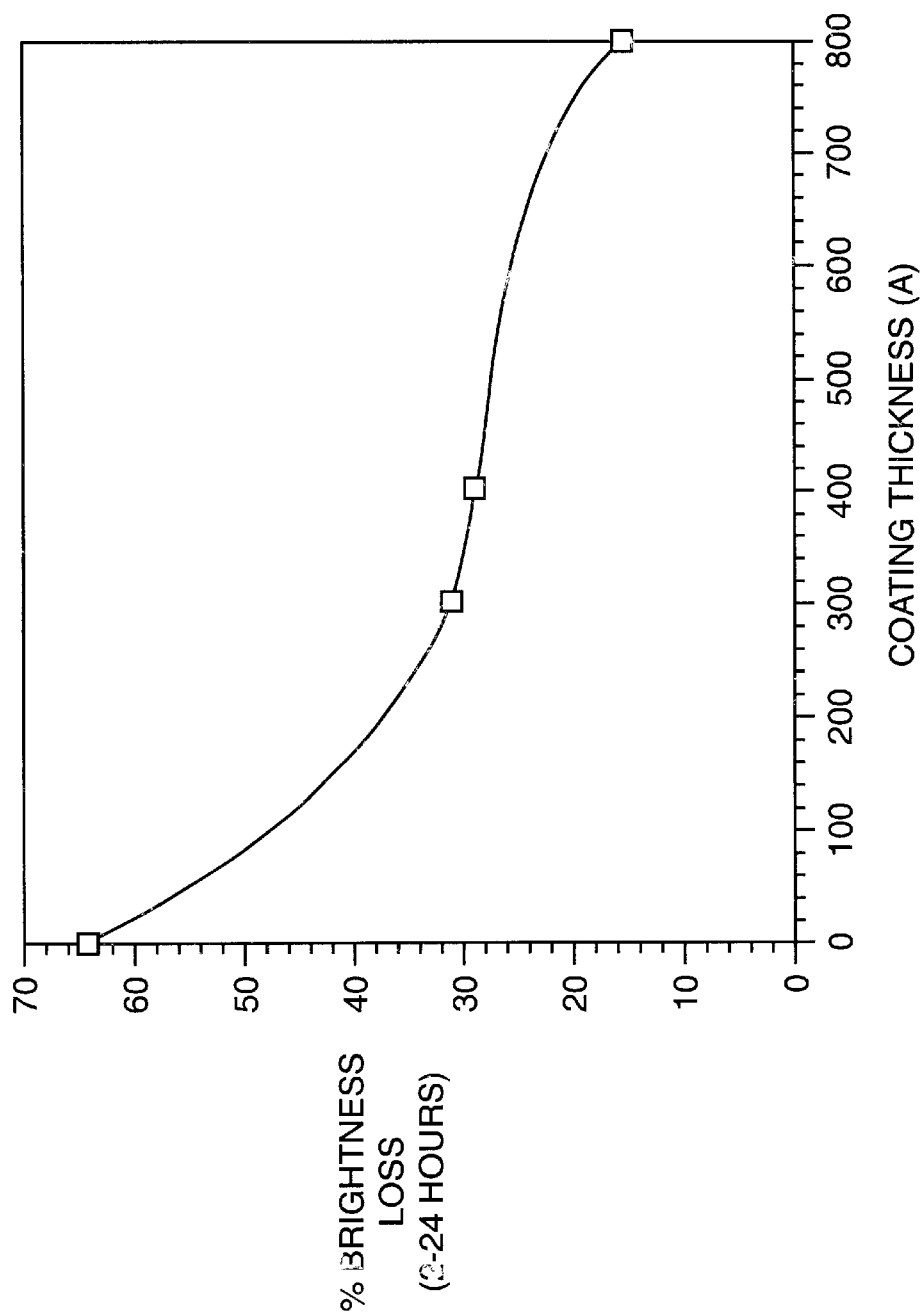
FIG. 11 shows a chart of percent change in EL lamp brightness vs. coating thickness.

The electroluminescent lamps were tested to determine the effectiveness of the coating in protecting the lamps from the deleterious effects of moisture. The lamp outputs were then sampled after 2 hours and 24 hours of operation at 21° C., 100 volts, and 400 Hz while under 50 percent relative humidity. FIG. 10 shows a chart of the electroluminescent lamp brightnesses and brightness differences vs. the coating thickness in angstroms. Initially the coating thickness has little effect on brightness. After 24 hours the thicker the coating, the greater the remaining brightness, or equally, after 24, the less the decrease in brightness. FIG. 11 shows a chart of the percent change in electroluminescent lamp brightness vs. coating thickness. As shown in the FIGS. 10 and 11 while the lamp brightness measured after 2 hours of burning decreased slightly with increasing coating thickness, the brightness measured after 24 hours of operation increased rapidly as the coating thickness increased. These data, along with those presented in Example 2, demonstrate that, using the new particle coating method, protective coatings may be uniformly deposited on the surfaces of fluidized particulate materials by vapor deposition processes at temperatures lower than those of the heated coating precursor transport lines. Further, as demonstrated in Example 3, this cannot be accomplished using conventional fluidized bed particle coating methods.

Figure 12:
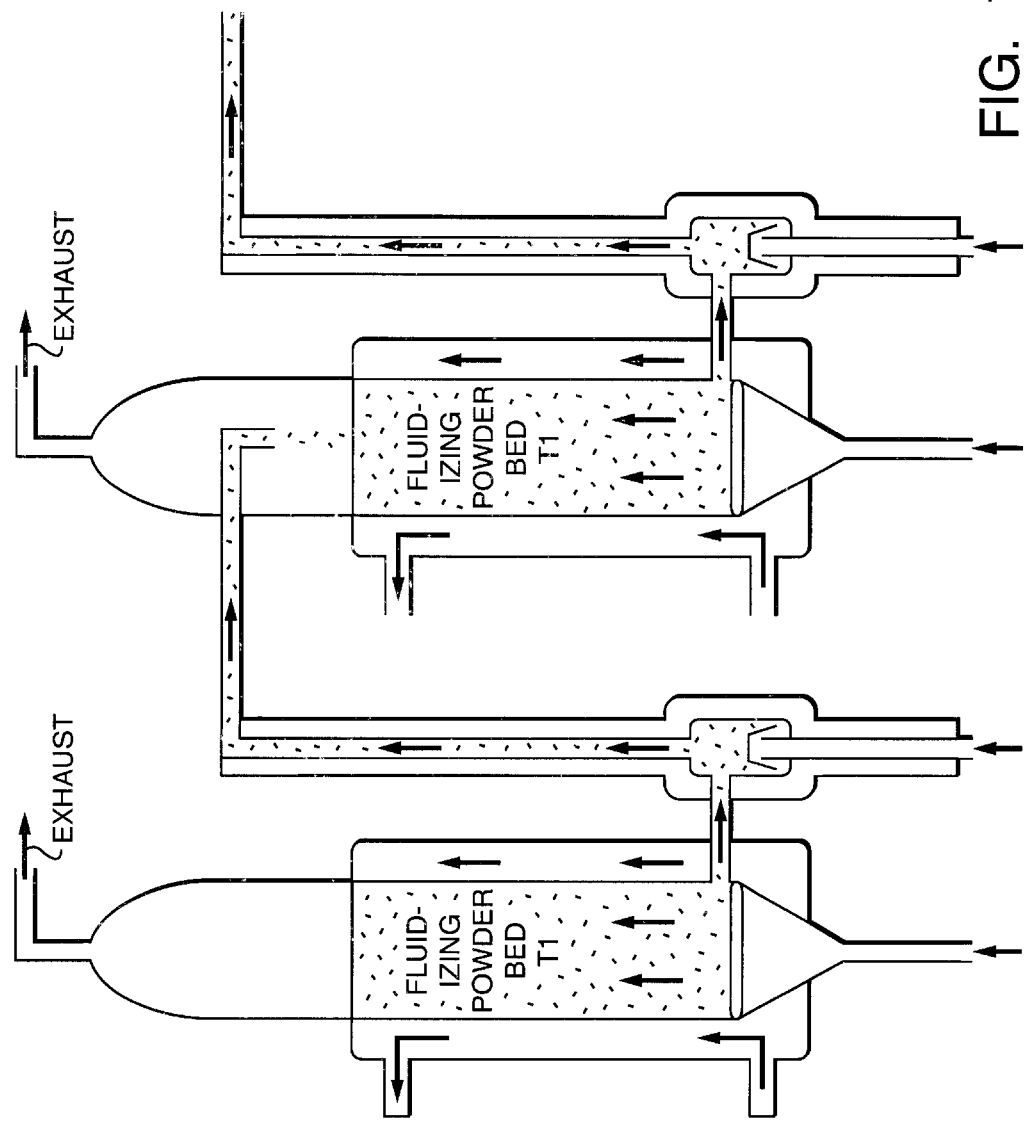
FIG. 12 shows the beginning of a chained system multiple reactors.

Numerous variations in the equipment, and the operation can be conceived. For example, method includes such variations as the use of multiple risers, a single riser with multiple outlets, and multiple risers with a single outlet. One may also chain a first main reactor to a first riser to a second main reactor to a second riser and so on, as shown in FIG. 12. The chained system in FIG. 12 would enable fine control of the total coating on the average particle, as exactly N coats (the number of the chained risers) would exist on each finally emerging particle. Similarly the chained system in FIG. 12 would enable alternate coating layers, with each riser in the chain associated with a different coating material. Likewise, each of the subsequent fluidizing gases of the main reactors could be a reactant to the incoming coating layer. The riser inlet(s) may be at any level(s) in the fluidized main reactor bed, and similarly for the main reactor bed outlet(s). Likewise, the riser inlet and riser outlet tube openings may be located at any position relative to the main reactor bed cross sectional area, for example, near the axial center of the bed or near the exterior wall. Pneumatic transport efficiency can be controlled independent of the operation of the main reactor by adjusting the diameter and length of the fluidized bed and riser feed pipe(s), the size(s) and length(s) of the riser(s), or the riser gas flow(s).

Also included in the scope of this method are the known classes of coating deposition reactions known as vapor deposition and vapor deposition polymerization reactions. With such processes, useful coatings can be deposited on the surfaces of the individual particles contained in a fluidized particle bed only if the particle surface temperatures are substantially lower than those of the coating precursor transport lines. This situation is difficult if not impossible to achieve using conventional fluidized bed particle coating techniques in which the temperature of the end of the precursor containing gas line must be essentially the same as that of the fluidized particle bed since it is in physical contact with this particle bed. See for example the particle coating U.S. Pat. Nos. 4,585,673; 5,051,277, and 5,080,928.

Figure 13:
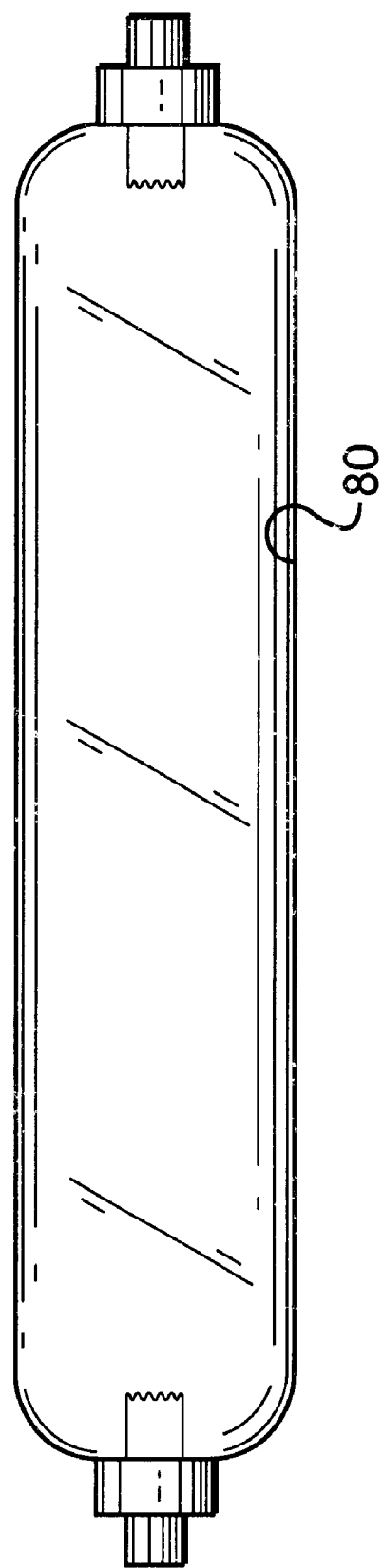
FIG. 13 shows a schematic view of a fluorescent lamp.
Figure 14:
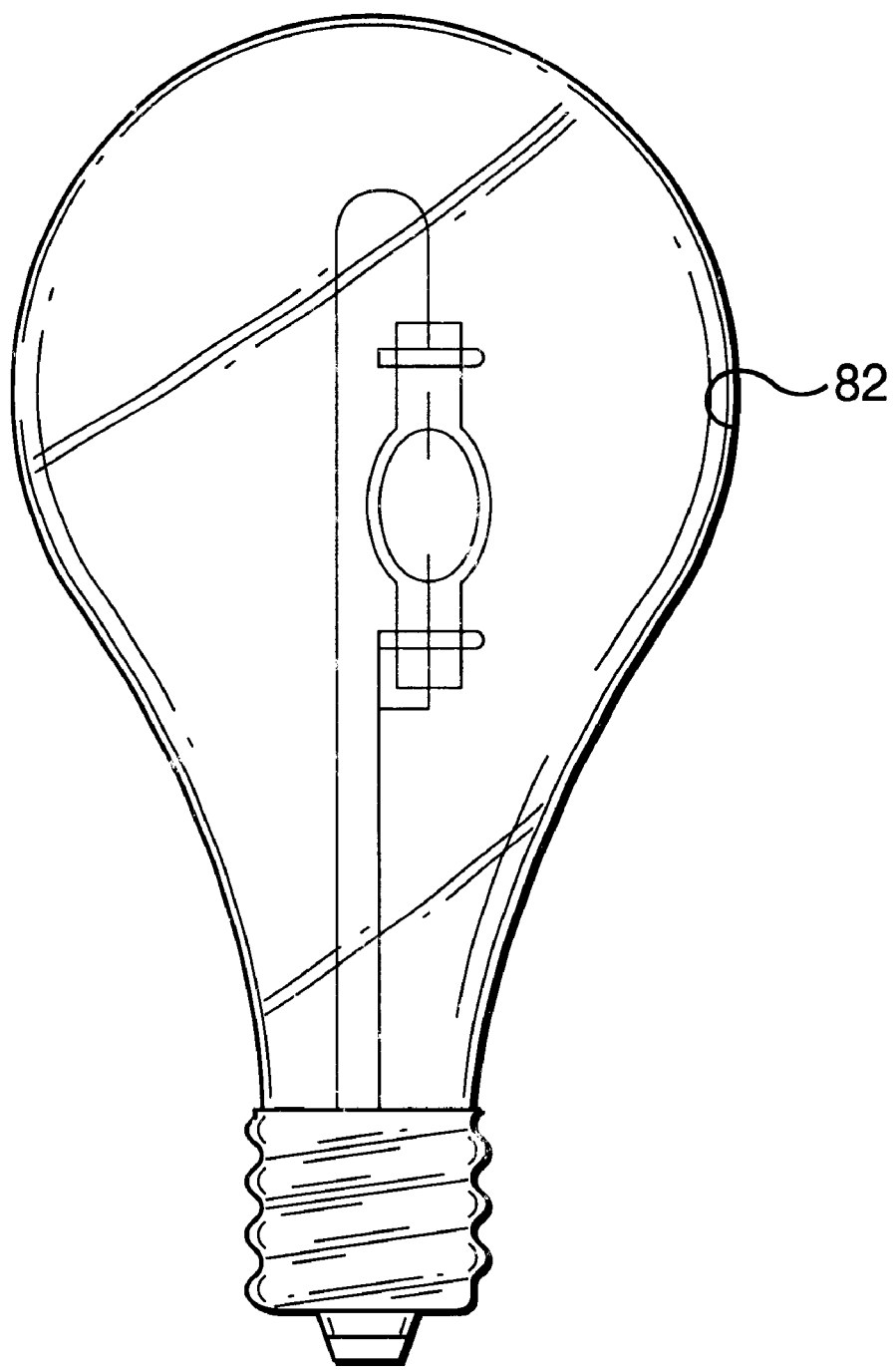
FIG. 14 shows a schematic view of a high pressure discharge lamp.

It is understood that coated phosphors made according to method described may be advantageously be used in both low and high pressure discharge lamp systems. FIG. 13 shows a schematic view of a fluorescent lamp with a coated phosphor layer 80. FIG. 14 shows a schematic view of a high pressure discharge lamp with a coated phosphor layer 82.

While there have been shown and described what are at present considered to be the preferred embodiments of the invention, it will be apparent to those skilled in the art that various changes and modifications can be made herein without departing from the scope of the invention defined by the appended claims.

What is claimed is:

1. A method of making a particle with a reacted coating comprising the steps of:
   a) providing main chamber operating at a first temperature T1,
   b) locating in the main chamber a multiplicity of free particles having a core composition;
   c) providing a riser chamber operating with a wall temperature T3 greater than T1,
   d) providing a flow into the riser chamber of a precursor coating material having a cooling reaction temperature T4 less than T3 but not less than T1, the precursor material flow being made at a flow temperature T2 greater than T4;
   e) providing a flow of the particles from the main chamber at a temperature less than the cooling reaction temperature T4, into the riser chamber to intimately mix with the flow of the precursor material, wherein relative to the precursor material temperature and density, the incoming particles have a sufficient thermal mass, and a low enough temperature, and the particles pass through the riser chamber sufficiently quickly, that the particles emerge from the riser chamber with a condensation coating of the precursor material;
   f) guiding the combined flows of the particles and coating material to an exhaust flow;
   g) separating the coated particles from the exhaust flow and
   h) returning the coated particles to a main reactor chamber operating at a temperature less than the cooling reaction temperature T4.

2. A method of making a particle with a reacted coating comprising the steps of:
   a) providing main chamber operating at a first temperature T1,
   b) locating in the main chamber a multiplicity of free particles having a core composition;
   c) providing a riser chamber operating with a wall temperature T3 greater than T1,
   d) providing a flow into the riser chamber of a precursor coating material having a cooling reaction temperature T4 less than T3 but not less than T1, the precursor material flow being made at a flow temperature T2 greater than T4;
   e) providing a flow of the particles from the main chamber at a temperature less than the cooling reaction temperature T4, into the riser chamber to intimately mix with the flow of the precursor material whereby the particles may be coated with the precursor material and wherein the temperature of the incoming precursor material is sufficiently above the reaction temperature of the precursor material, and sufficiently dilute, so that substantially all of the precursor material is condensed on the particles as the particles pass through the riser chamber, and little or none of the precursor material passes into the main reactor that is not coated on the particles;
   f) guiding the combined flows of the particles and coating material to an exhaust flow;
   g) separating the coated particles from the exhaust flow and
   h) returning the coated particles to a main reactor chamber operating at a temperature less than the cooling reaction temperature T4.

3. A method of making a particle with a reacted coating comprising the steps of:
   a) providing main chamber operating at a first temperature T1,
   b) locating in the main chamber a multiplicity of free particles having a core composition;
   c) providing a riser chamber operating with a wall temperature T3 greater than T1,
   d) providing a flow into the riser chamber of a precursor coating material having a cooling reaction temperature T4 less than T3 but not less than T1, the precursor material flow being made at a flow temperature T2 greater than T4, wherein the coating material comprises one of a group consisting of parrafins, poly(vinylidene fluoride), polyethylene, and Π-conjugated electrically conductive polymers such as poly(p-phenylene), poly (2,5-thienylene), poly(2,2'-bipyridine-5,5'-diyl), and poly(pyridine-2-5-diyl);
   e) providing a flow of the particles from the main chamber at a temperature less than the cooling reaction temperature T4, into the riser chamber to intimately mix with the flow of the precursor material whereby the particles may be coated with the precursor material by vapor deposition;
   f) guiding the combined flows of the particles and coating material to an exhaust flow;
   g) separating the coated particles from the exhaust flow and h) returning the coated particles to a main reactor chamber operating at a temperature less than the cooling reaction temperature T4.

4. A method of making a particle with a reacted coating comprising the steps of:

a) providing main chamber operating at a first temperature T1, b) locating in the main chamber a multiplicity of free particles having a core composition;

c) providing a riser chamber operating with a wall temperature T3 greater than T1, d) providing a flow into the riser chamber of a precursor coating material having a cooling reaction temperature T4 less than T3 but not less than T1, the precursor material flow being made at a flow temperature T2 greater than T4;

e) providing a flow of the particles from the main chamber at a temperature less than the cooling reaction temperature T4, into the riser chamber to intimately mix with the flow of the precursor material whereby the particles may be coated with the precursor material and the coating is deposited by vapor deposition polymerization;

f) guiding the combined flows of the particles and coating material to an exhaust flow;

g) separating the coated particles from the exhaust flow and h) returning the coated particles to a main reactor chamber operating at a temperature less than the cooling reaction temperature T4.

5. The method in claim 4, wherein the coating material comprises one of a group consisting of polymeric aminoborane, poly(p-xylylene) and its derivatives such as (2,2)paracyclophane and 1,4-dichloro-(2,2)paracyclophane, p-phenylene-terephthalamide, 4,4'-diaminodiphenylether, alkylpolyamide, poly(decamethylene-terephthalamide, and poly(decamethyl-enepyromellitamic acid.

* * * * *